United States Patent
Dutta et al.

(10) Patent No.: US 10,546,852 B2
(45) Date of Patent: Jan. 28, 2020

(54) INTEGRATED SEMICONDUCTOR DEVICES AND METHOD OF FABRICATING THE SAME

(71) Applicant: QUALCOMM Incorporated, San Diego, CA (US)

(72) Inventors: Ranadeep Dutta, Del Mar, CA (US); Matthew Michael Nowak, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 15/970,618

(22) Filed: May 3, 2018

(65) Prior Publication Data
US 2019/0341381 A1    Nov. 7, 2019

(51) Int. Cl.
| | |
|---|---|
| *H01L 29/22* | (2006.01) |
| *H01L 27/06* | (2006.01) |
| *H01L 27/092* | (2006.01) |
| *H01L 21/8249* | (2006.01) |
| *H01L 29/93* | (2006.01) |
| *H01L 29/205* | (2006.01) |
| *H01L 29/737* | (2006.01) |

(52) U.S. Cl.
CPC ...... *H01L 27/0623* (2013.01); *H01L 21/8249* (2013.01); *H01L 27/092* (2013.01); *H01L 29/205* (2013.01); *H01L 29/7371* (2013.01); *H01L 29/93* (2013.01)

(58) Field of Classification Search
CPC ..... H01L 29/93; H01L 29/05; H01L 29/7371; H01L 21/8249; H01L 27/0623; H01L 27/092
See application file for complete search history.

(56) References Cited

U.S. PATENT DOCUMENTS

| | | | | |
|---|---|---|---|---|
| 5,081,517 A | * | 1/1992 | Contiero | H01L 27/0623 257/370 |
| 5,691,226 A | * | 11/1997 | Foerstner | H01L 21/74 148/DIG. 9 |
| 6,525,388 B1 | * | 2/2003 | Shimawaki | H01L 27/0605 257/197 |
| 6,830,967 B1 | | 12/2004 | Yin et al. | |
| 7,875,952 B1 | | 1/2011 | Elliott et al. | |
| 2002/0179957 A1 | * | 12/2002 | Traylor | H01L 21/8258 257/312 |

(Continued)

FOREIGN PATENT DOCUMENTS

CN    103489859 B    3/2016

OTHER PUBLICATIONS

By Herrick et al. ("Herrick"), ("Direct Growth of III-v Devices on Silicon"), Matter Res. Soc. Symp. Proc., vol. 1068, 2008, pp. 1-6.*

(Continued)

*Primary Examiner* — Ahmed N Sefer

(57) ABSTRACT

A semiconductor device comprises a complementary metal oxide semiconductor (CMOS) device and a heterojunction bipolar transistor (HBT) integrated on a single die. The CMOS device may comprise silicon. The HBT may comprise III-V materials. The semiconductor device may be employed in a radio frequency front end (RFFE) module to reduce size and parasitics of the RFFE module and to provide cost and cycle time savings.

23 Claims, 10 Drawing Sheets

(56) References Cited

U.S. PATENT DOCUMENTS

| | | | |
|---|---|---|---|
| 2003/0013284 A1* | 1/2003 | Emrick | H01L 21/8258 438/575 |
| 2005/0104127 A1* | 5/2005 | Kang | H01L 21/84 257/350 |
| 2007/0051981 A1 | 3/2007 | Brar | |
| 2007/0145367 A1 | 6/2007 | Chen et al. | |
| 2007/0173010 A1* | 7/2007 | Lee | G11C 13/0004 438/235 |
| 2008/0111154 A1* | 5/2008 | Voldman | H01L 21/8249 257/192 |
| 2009/0286368 A1* | 11/2009 | Lam | H01L 21/8249 438/234 |
| 2010/0181674 A1* | 7/2010 | Tabatabaie | H01L 21/8258 257/761 |
| 2010/0295104 A1* | 11/2010 | Kaper | H01L 21/8258 257/288 |
| 2011/0180857 A1 | 7/2011 | Hoke et al. | |
| 2012/0306082 A1 | 12/2012 | Sekar et al. | |
| 2013/0063223 A1 | 3/2013 | See et al. | |
| 2015/0194538 A1* | 7/2015 | Marino | H01L 29/94 327/530 |
| 2015/0200284 A1* | 7/2015 | Henderson | H01L 29/66242 257/197 |
| 2015/0318283 A1* | 11/2015 | Bayram | H01L 21/8258 257/369 |
| 2016/0284656 A1* | 9/2016 | Rinck | H01L 24/13 |
| 2017/0005111 A1* | 1/2017 | Verma | H01L 27/1207 |
| 2017/0110492 A1* | 4/2017 | Gordon | G01T 1/026 |

OTHER PUBLICATIONS

International Search Report and Written Opinion—PCT/US2019/030436—ISA/EPO—Sep. 30, 2019.

Urteaga M., et al., "InP HBT Technologies for THz Integrated Circuits", Proceedings of the IEEE, New York, US, vol. 105, No. 6, Jun. 2017 (Jun. 2017), pp. 1051-1067, XP011650418, ISSN: 0018-9219, DOI: 10.1109/JPROC.2017.2692178 [retrieved on May 18, 2017].

* cited by examiner

INTEGRATED SEMICONDUCTOR DEVICES AND METHOD OF FABRICATING THE SAME

BACKGROUND

Field

Certain aspects of the present disclosure generally relate to integrated circuits (ICs), and more particularly, to semiconductor device with complementary metal oxide semiconductor (CMOS) devices and heterojunction bipolar transistors (HBTs) integrated on a single die.

Background

Radio frequency front end (RFFE) module for mobile phones typically consists of a variety of electronic devices, such as control circuits, switches, filters, and power amplifiers (PAs). Control circuits and switches are generally fabricated using complementary metal oxide semiconductor (CMOS) process on Silicon (Si) substrate. On the other hand, PAs generally comprise heterojunction bipolar transistors (HBTs) fabricated from III-V materials (compounds of group III materials, including e.g., Aluminum (Al), Gallium (Ga), and Indium (In) and group V materials, including e.g., Nitrogen (N), Phosphorus (P), Arsenic (As), and Antimony (Sb) in the periodic table).

Due to the use of different materials for CMOS devices and PAs, they are typically assembled as discrete components on a laminate substrate to form a RFFE module. However, the discrete components on the laminate substrate lead to high parasitic resistance, high parasitic inductance, and high parasitic capacitance, which results in a significant impact on the performance of the RFFE module at high frequency bands, such as the fifth generation (5G) frequency bands for mobile communication. The discrete components on the laminate substrate also lead to a large size for the RFFE module. In addition, the discrete components are generally fabricated in separate facilities, which increases cost and cycle time. Thus, there is a need to develop a process to integrate CMOS devices and PAs on a single die to reduce size and parasitics of the RFFE module and to provide cost and cycle time savings.

One approach to integrate CMOS devices and PAs on a single die may employ wafer bonding techniques. However, CMOS devices are generally fabricated on 300 millimeter (mm) Si wafers, whereas PAs comprising HBTs are generally fabricated on 150 mm or 75 mm wafers for III-V materials. The difference sizes of the wafers make it impractical for wafer bonding between Si wafers and wafers for III-V materials. Therefore, it is beneficial to develop a process to fabricate PAs on Si wafers for integration with CMOS devices.

SUMMARY

Certain aspects of the present disclosure provide a semiconductor device. The semiconductor device may include a complementary metal oxide semiconductor (CMOS) device on a die. The semiconductor device may also include a heterojunction bipolar transistor (HBT) on the die.

Certain aspects of the present disclosure provide a method for fabricating a semiconductor device. The method may include forming a series of layers on a first substrate. The method may also include patterning the series of layers on the first substrate to form a varactor. The method may also include forming a first silicon dioxide ($SiO_2$) layer to cover the varactor on the first substrate. The method may also include bonding the first $SiO_2$ layer to a second $SiO_2$ layer covering a CMOS device on a second substrate. The method may also include removing the first substrate. The method may also include patterning the series of layers to form an HBT. The method may also include forming a dielectric layer to cover the varactor and the HBT. The method may further include forming contacts for the varactor, the CMOS device, and the HBT.

Certain aspects of the present disclosure provide a method for fabricating a semiconductor device. The method may include forming a first CMOS device on a first substrate. The method may also include forming a series of III-V material layers on the first substrate. The method may also include patterning the series of III-V material layers on the first substrate to form an HBT. The method may also include forming a first $SiO_2$ layer to cover the first CMOS device and the HBT on the first substrate. The method may further include forming a first plurality of contacts for the first CMOS device and the HBT.

This summary has outlined, rather broadly, the features and embodiments of the present disclosure so that the following detailed description may be better understood. Additional features and embodiments of the present disclosure will be described below. It should be appreciated by those skilled in the art that this disclosure may be readily utilized as a basis for modifying or designing other equivalent structures for carrying out the same purposes of the present disclosure. It should also be realized by those skilled in the art that such equivalent constructions do not depart from the teachings of the present disclosure as set forth in the appended claims. The features, which are believed to be characteristic of the present disclosure, both as to its organization and method of operation, will be better understood from the following description when considered in connection with the accompanying figures. It is to be expressly understood, however, that each of the figures is provided for the purpose of illustration and description only and is not intended as a definition of the limits of the present disclosure.

DETAILED DESCRIPTION

Figure 1:
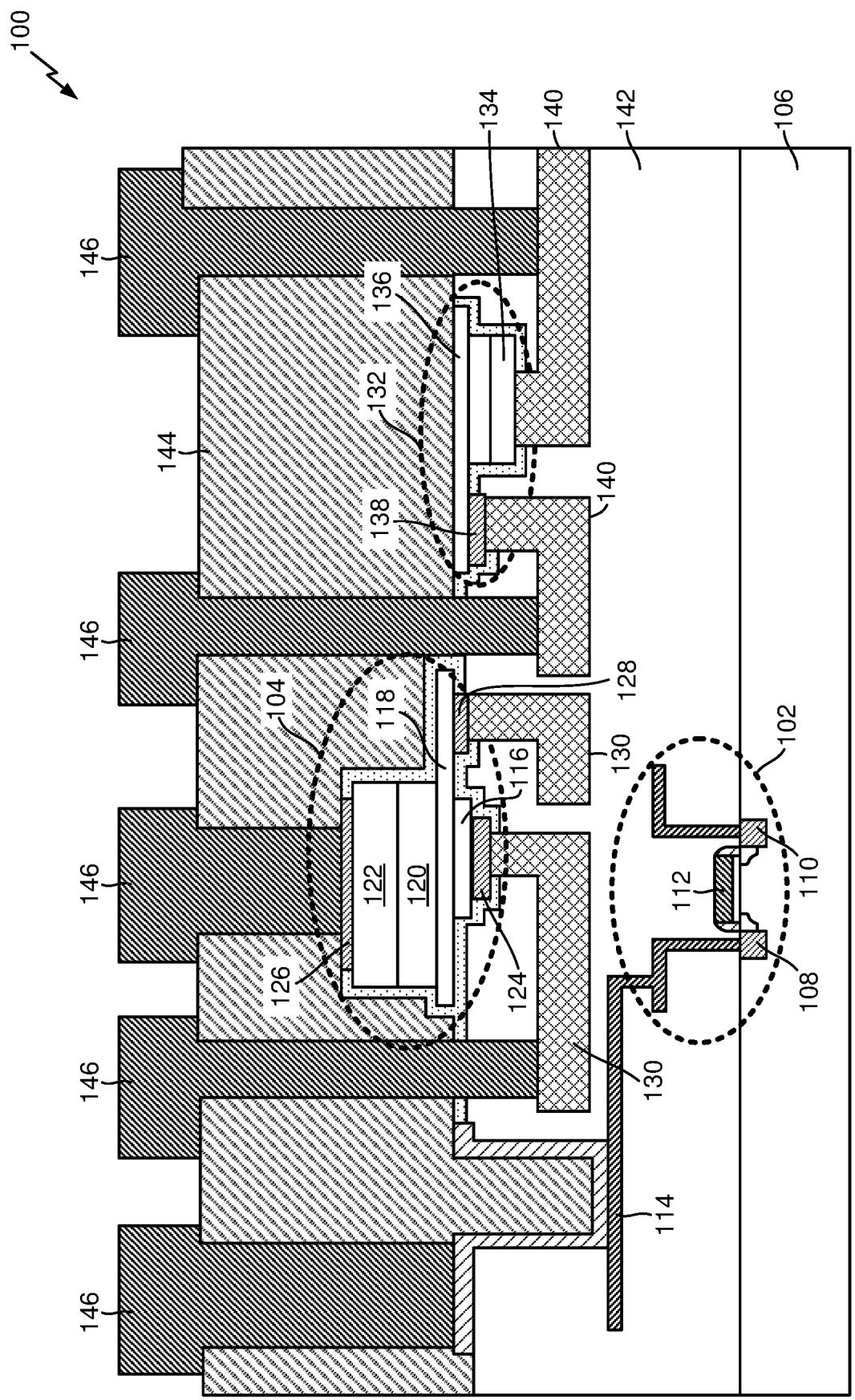
FIG. 1 illustrates an exemplary semiconductor device having a complementary metal oxide semiconductor (CMOS) device and a heterojunction bipolar transistor (HBT) integrated on a single die in accordance with certain aspects of the present disclosure.

With reference to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

The detailed description set forth below, in connection with the appended drawings, is intended as a description of various aspects and is not intended to represent the only aspect in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts.

Aspects disclosed in the detailed description include a complementary metal oxide semiconductor (CMOS) device and a heterojunction bipolar transistor (HBT) integrated on a single die. The CMOS device is fabricated using Silicon (Si). The HBT is fabricated using III-V materials (compounds of group III materials and group V materials in the periodic table, such as Gallium Arsenide (GaAs) and Indium Phosphide (InP)). In certain aspects, a semiconductor device comprises a CMOS device on a die. The semiconductor device also comprises an HBT on the die. The CMOS device comprises Si. The HBT comprises III-V materials. The die comprises Si. The semiconductor device may be employed in a radio frequency front end (RFFE) module to reduce size and parasitics of the RFFE module and to provide cost and cycle time savings.

In this regard, FIG. 1 illustrates an exemplary semiconductor device having a CMOS device and an HBT integrated on a single die in accordance with certain aspects of the present disclosure. A semiconductor device 100 is shown in FIG. 1, which comprises a CMOS device 102 and an HBT 104 on a single die. As an example, the single die may comprise a Si substrate 106. The CMOS device 102 comprises a drain region 108, a source region 110, and a gate 112. As an example, the drain region 108, the source region 110, and the gate 112 may comprise Si. The CMOS device 102 also comprises first contacts 114 to connect the CMOS device 102 to other components in the semiconductor device 100. As an example, the first contacts 114 may comprise Aluminum (Al) or Copper (Cu). The CMOS device 102 may also comprise any device fabricated using CMOS process, including passive devices, such as capacitors and inductors.

With continuing reference to FIG. 1, the HBT 104 comprises an emitter 116, a collector 120, and a base 118 between the emitter 116 and the collector 120. As an example, the emitter 116 may comprise an N+ GaAs layer, an Indium Gallium Arsenide (InGaAs) contact layer, and an InGaAs graded layer between the N+ GaAs layer and the InGaAs contact layer. The InGaAs graded layer is employed to reduce stress caused by lattice mismatch between GaAs and InGaAs in the InGaAs contact layer. The collector 120 may comprise an N− GaAs collector. The base 118 may comprise a P+ GaAs base. The HBT 104 also comprises a sub-collector 122, an emitter metal 124, a collector metal 126, and a base metal 128. As an example, the sub-collector 122 may comprise an N+ GaAs sub-collector. The emitter metal 124 may comprise Titanium (Ti)/Platinum (Pt), which forms an ohmic contact with the InGaAs contact layer of the emitter 116. The collector metal 126 may comprise Palladium (Pd)/Germanium (Ge). The base metal 128 may comprise Pt/Ti. The HBT 104 further comprises second contacts 130 to connect the HBT 104 to other components in the semiconductor device 100. As an example, the second contacts 130 may comprise Ti/Pt/Cu. The CMOS device 102 and the HBT 104 are integrated on the single die in the semiconductor device 100, which may be employed in a RFFE module to reduce size and parasitics of the RFFE module and to provide cost and cycle time savings.

With continuing reference to FIG. 1, the semiconductor device 100 may also comprise a varactor 132 on the single die. Varactors usually have variable capacitance which is a function of a bias voltage applied to the varactors' terminals (e.g., cathode and anode). Varactors are generally reversely biased, where a size of a depletion region of a varactor varies with an applied bias voltage resulting in a capacitance change of the varactor. If the applied bias voltage increases, the size of the depletion region increases resulting in a decrease of a capacitance of the varactor. If the applied bias voltage decreases, the size of the depletion region decreases resulting in an increase of a capacitance of the varactor. The varactor 132 comprises an anode 134 and a cathode 136. As an example, the anode 134 may comprise N− GaAs. The cathode 136 may comprise an N+ GaAs layer, an InGaAs contact layer, and an InGaAs graded layer between the N+ GaAs layer and the InGaAs contact layer. As mentioned above, the InGaAs graded layer is employed to reduce the stress caused by the lattice mismatch between GaAs and InGaAs in the InGaAs contact layer. The varactor 132 further comprises third contacts 140 to connect the varactor 132 to other components in the semiconductor device 100. As an example, the third contacts 140 may comprise Ti/Pt/Cu. The second contacts 130 and the third contacts 140 may reside in a Metal 1 layer (i.e., a first layer of interconnect). The third contacts 140 form a Schottky contact with the anode 134 of the varactor 132. The Schottky contact is employed to form a depletion region during operation of the varactor 132. The third contacts 140 form an ohmic contact with the cathode 136 of the varactor 132 through a cathode contact layer 138 on the InGaAs contact layer of the cathode 136. The cathode contact layer 138 may comprise Ti/Pt. The ohmic contact is employed to improve quality factor of the varactor 132. By integrating the varactor 132 and the HBT 104 on the single die, a capacitance change of the varactor 132 may be employed to enable dynamic impedance tuning to optimize performance of the HBT 104 for power amplifier applications.

With continuing reference to FIG. 1, the semiconductor device 100 may also comprise a first dielectric layer 142, a second dielectric layer 144 covering the HBT 104 and the varactor 132, and fourth contacts 146 to connect the semiconductor device 100 to other devices. As an example, the first dielectric layer 142 may comprise Silicon Dioxide (SiO$_2$). The second dielectric layer 144 may comprise Polyimide (PI). The fourth contacts 146 may comprise Ti/Pt/Cu. The first dielectric layer 142 has a first side and a second side opposite the first side. The CMOS device 102 is coupled to the first side of the first dielectric layer 142. The HBT 104 is coupled to the second side of the first dielectric layer 142. The varactor 132 is coupled to the second side of the first dielectric layer 142.

Figure 2:
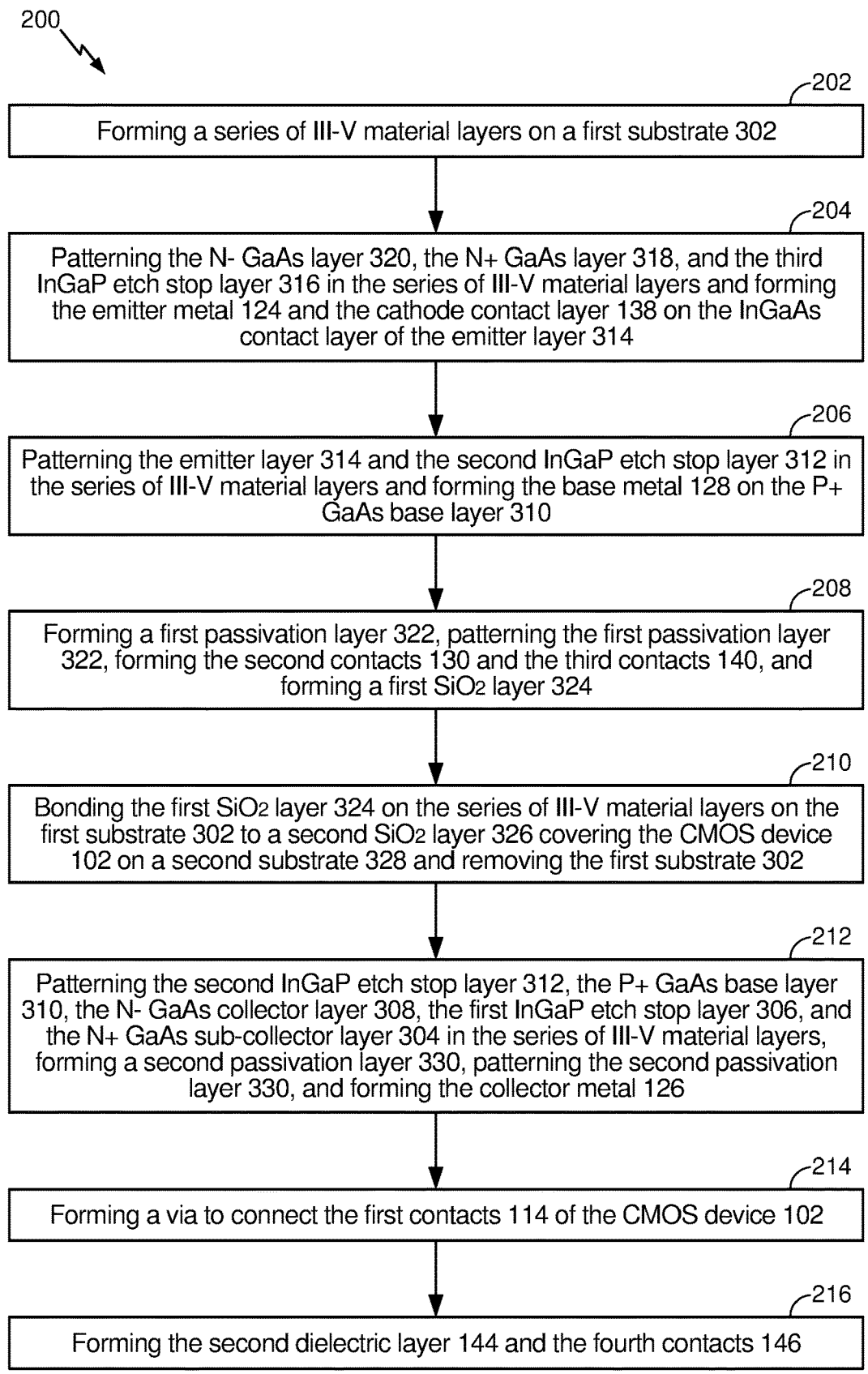
FIG. 2 provides a flow chart illustrating an exemplary fabrication process for the semiconductor device of FIG. 1 in accordance with certain aspects of the present disclosure.

FIG. 2 illustrates an exemplary fabrication process 200 for the semiconductor device 100 in FIG. 1 in accordance with certain aspects of the present disclosure. FIGS. 3A-3D provide cross-sectional diagrams of the semiconductor device 100 of FIG. 1 illustrating respective stages 300(1)-300(8) of the fabrication process 200 in FIG. 2. The cross-sectional diagrams illustrating the semiconductor device 100 in FIGS. 3A-3D will be discussed in conjunction with the discussion of the exemplary steps in the fabrication process 200 in FIG. 2.

Figure 3A:
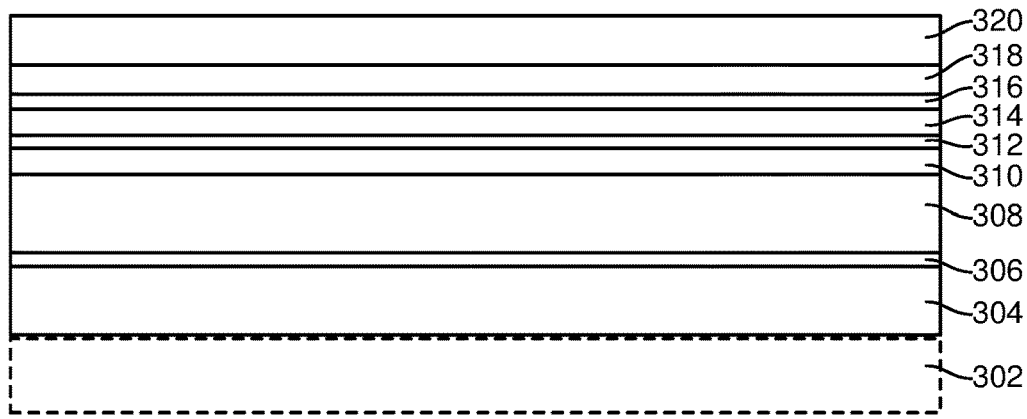
FIGS. 3A-3D provide cross-sectional diagrams of the semiconductor device of FIG. 1 at each stage of the process of fabrication in FIG. 2.
Figure 3A:
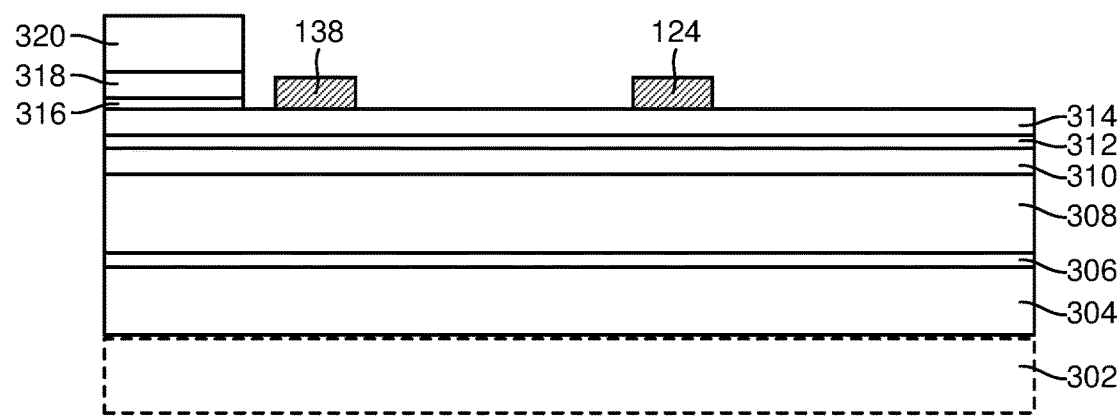
Figure 3A:
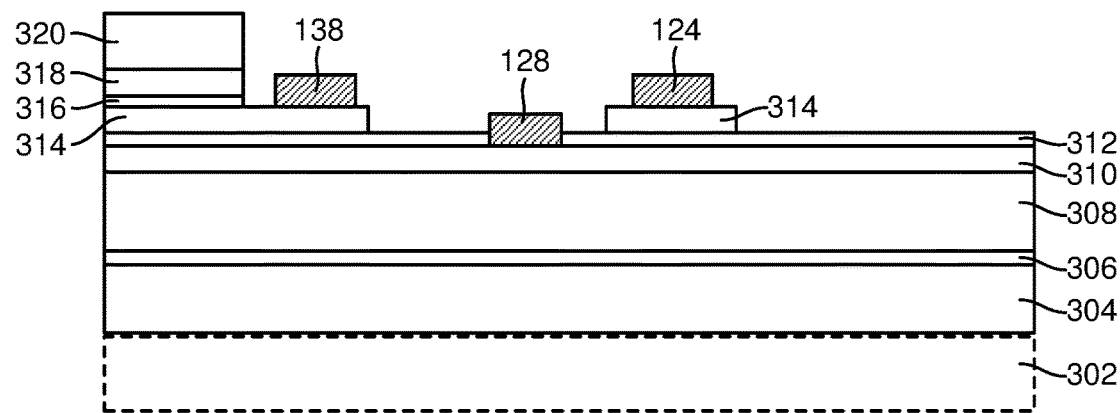

In this regard, the fabrication process 200 in FIG. 2 includes forming a series of III-V material layers on a first substrate 302 (block 202, stage 300(1) of FIG. 3A). As an example, the first substrate 302 may comprise a 300 millimeter (mm) Si wafer. The series of III-V material layers may comprise an N+ GaAs sub-collector layer 304 on the first substrate 302, a first Indium Gallium Phosphide (InGaP) etch stop layer 306 on the N+ GaAs sub-collector layer 304, an N– GaAs collector layer 308 on the first InGaP etch stop layer 306, a P+ GaAs base layer 310 on the N– GaAs collector layer 308, a second InGaP etch stop layer 312 on the P+ GaAs base layer 310, an emitter layer 314 on the second InGaP etch stop layer 312, a third InGaP etch stop layer 316 on the emitter layer 314, an N+ GaAs layer 318 on the third InGaP etch stop layer 316, and an N– GaAs layer 320 on the N+ GaAs layer 318. The emitter layer 314 may comprise an N+ GaAs layer, an InGaAs contact layer, and an InGaAs graded layer between the N+ GaAs layer and the InGaAs contact layer. As mentioned above, the InGaAs graded layer is employed to reduce the stress caused by the lattice mismatch between GaAs and InGaAs in the InGaAs contact layer. In another aspect, other III-V materials, such as InP, may be used in the series of III-V material layers. The series of III-V material layers may be formed by epitaxy on the first substrate 302.

The fabrication process 200 in FIG. 2 also includes patterning the N– GaAs layer 320, the N+ GaAs layer 318, and the third InGaP etch stop layer 316 in the series of III-V material layers and forming the emitter metal 124 and the cathode contact layer 138 on the InGaAs contact layer of the emitter layer 314 (block 204, stage 300(2) of FIG. 3A). As an example, the N– GaAs layer 320, the N+ GaAs layer 318, and the third InGaP etch stop layer 316 may be patterned by dry etching or wet etching. The emitter metal 124 and the cathode contact layer 138 may be formed by evaporation and lift-off process. The emitter metal 124 and the cathode contact layer 138 are formed on the InGaAs contact layer of the emitter layer 314. As mentioned above, the emitter metal 124 and the cathode contact layer 138 may form ohmic contacts with the InGaAs contact layer of the emitter layer 314.

The fabrication process 200 in FIG. 2 also includes patterning the emitter layer 314 and the second InGaP etch stop layer 312 in the series of III-V material layers and forming the base metal 128 on the P+ GaAs base layer 310 (block 206, stage 300(3) of FIG. 3A). As an example, the emitter layer 314 and the second InGaP etch stop layer 312 may be patterned by dry etching or wet etching. The base metal 128 may be formed by evaporation and lift-off process.

Figure 3B:
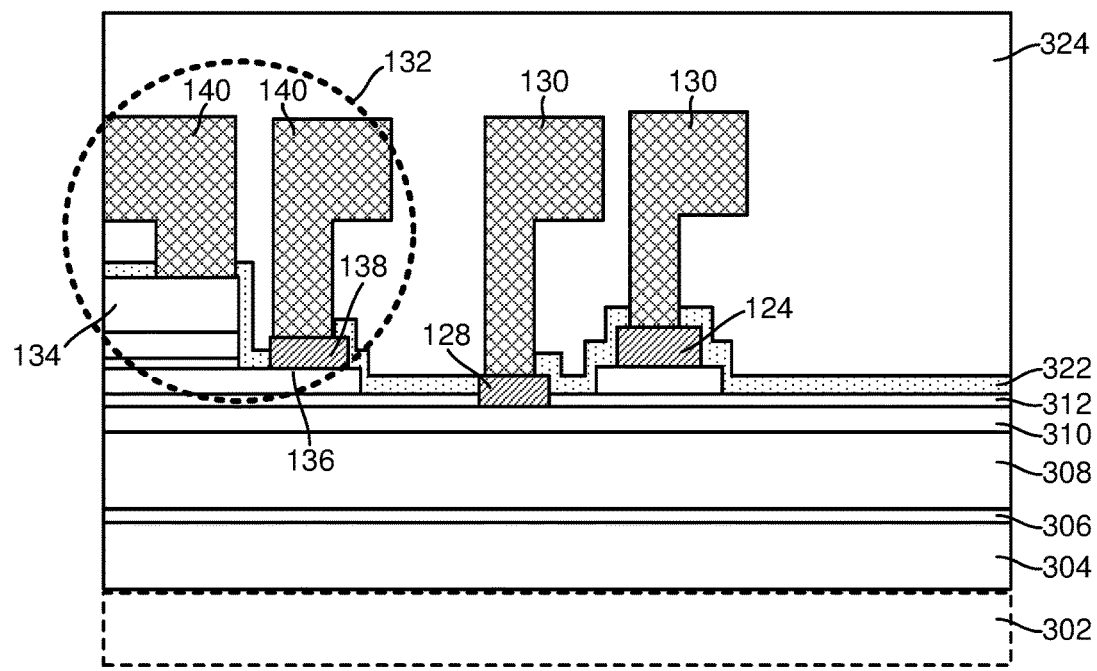
Figure 3B:
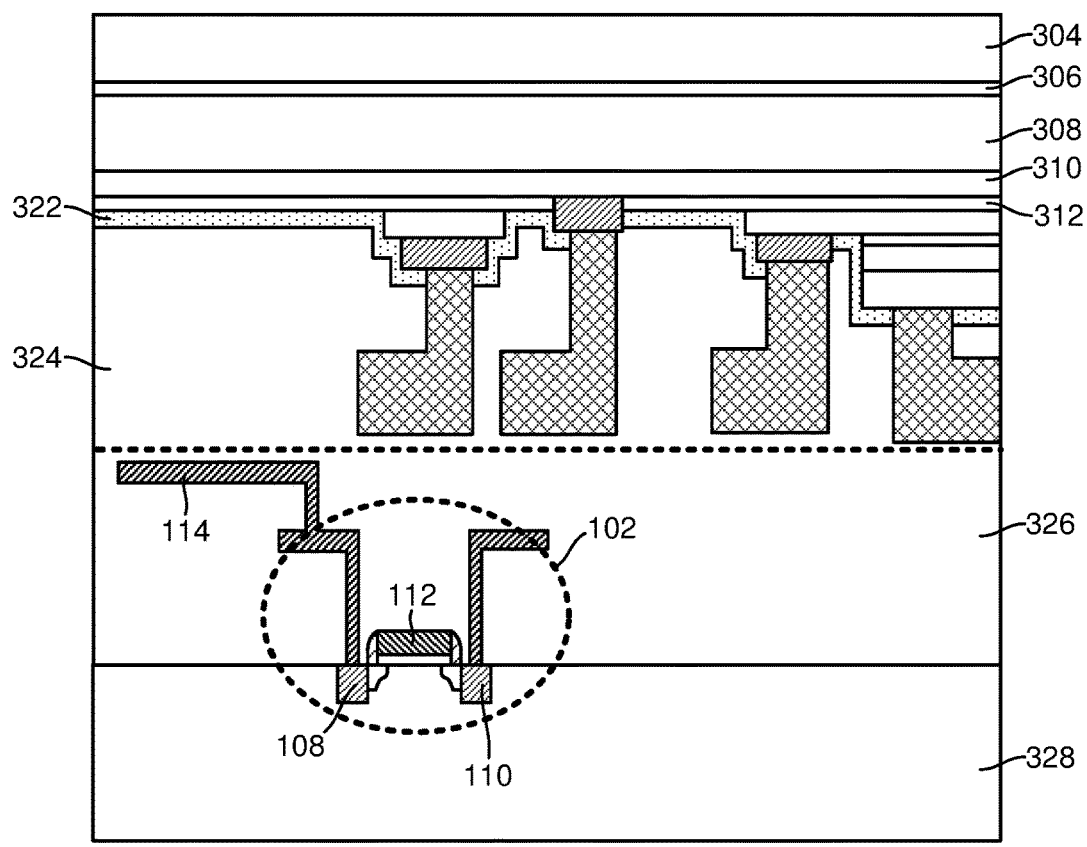

The fabrication process 200 in FIG. 2 also includes forming a first passivation layer 322, patterning the first passivation layer 322, forming the second contacts 130 and the third contacts 140, and forming a first SiO$_2$ layer 324 (block 208, stage 300(4) of FIG. 3B). As an example, the first passivation layer 322 may comprise Silicon Nitride (SiN). The varactor 132 is formed at this step. The varactor 132 comprises the anode 134, the cathode 136, the cathode contact layer 138, and the third contacts 140. The cathode 136 comprises the N+ GaAs layer, the InGaAs contact layer, and the InGaAs graded layer between the N+ GaAs layer and the InGaAs contact layer of the emitter layer 314. As mentioned above, the third contacts 140 form a Schottky contact with the anode 134 of the varactor 132. The Schottky contact is employed to form a depletion region during the operation of the varactor 132. The third contacts 140 form an ohmic contact with the cathode 136 of the varactor 132 through the cathode contact layer 138 on the InGaAs contact layer of the cathode 136. The ohmic contact is employed to improve the quality factor of the varactor 132.

The fabrication process 200 in FIG. 2 also includes bonding the first SiO$_2$ layer 324 on the series of III-V material layers on the first substrate 302 to a second SiO$_2$ layer 326 covering the CMOS device 102 on a second substrate 328 and removing the first substrate 302 (block 210, stage 300(5) of FIG. 3B). As an example, the second substrate 328 may comprise a 300 mm Si wafer. The first substrate 302 may be removed by grinding and wet etching. The CMOS device 102 comprises the drain region 108, the source region 110, the gate 112, and the first contacts 114. The first SiO$_2$ layer 324 and the second SiO$_2$ layer 326 form the first dielectric layer 142.

Figure 3C:
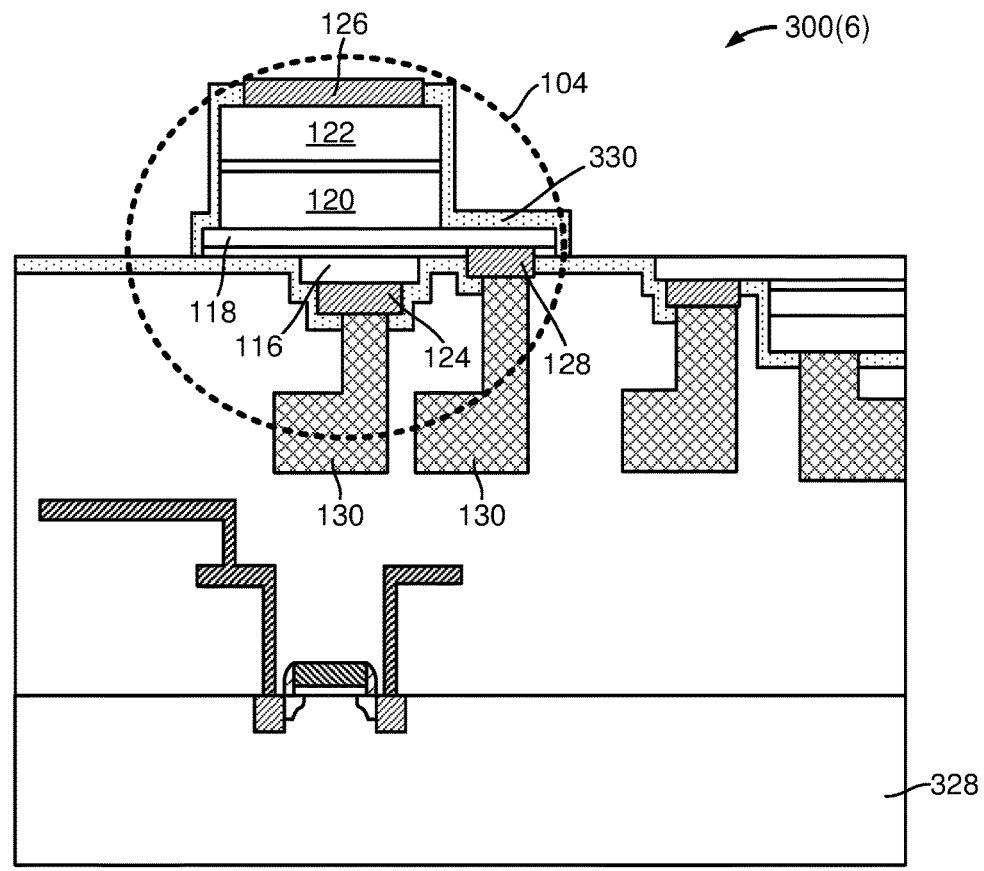
Figure 3C:
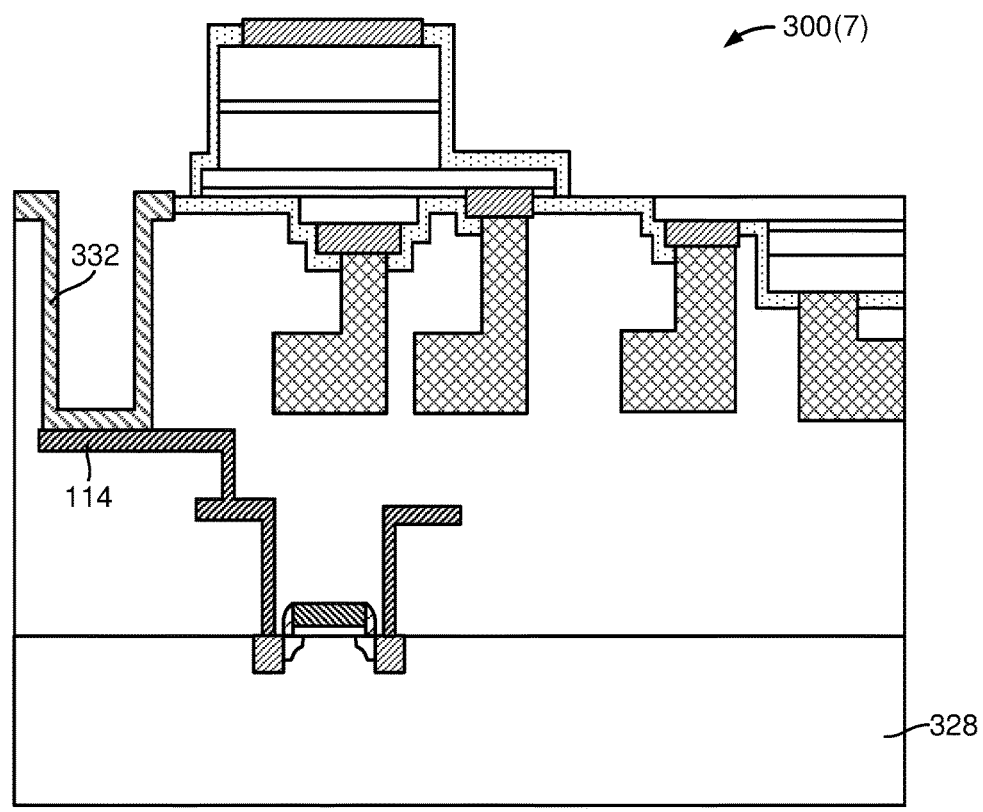

The fabrication process 200 in FIG. 2 also includes patterning the second InGaP etch stop layer 312, the P+ GaAs base layer 310, the N– GaAs collector layer 308, the first InGaP etch stop layer 306, and the N+ GaAs sub-collector layer 304 in the series of III-V material layers, forming a second passivation layer 330, patterning the second passivation layer 330, and forming the collector metal 126 (block 212, stage 300(6) of FIG. 3C). As an example, the second InGaP etch stop layer 312, the P+ GaAs base layer 310, the N– GaAs collector layer 308, the first InGaP etch stop layer 306, and the N+ GaAs sub-collector layer 304 may be patterned by dry etching or wet etching. The second passivation layer 330 may comprise SiN. The HBT 104 is formed at this step. The HBT 104 comprises the emitter 116, the collector 120, the base 118 between the emitter 116 and the collector 120, the sub-collector 122, the emitter metal 124, the collector metal 126, the base metal 128, and the second contacts 130. The varactor 132 and the HBT 104 use different layers in the series of III-V material layers. Thus, each layer in the varactor 132 and the HBT 104 may have independently customized thicknesses and doping profiles, which may provide optimized performance for the varactor 132 and the HBT 104. The varactor 132 and the HBT 104 are integrated on a single substrate (i.e., the second substrate 328). Thus, a capacitance change of the varactor 132 may be employed to enable dynamic impedance tuning to optimize the performance of the HBT 104 for power amplifier applications. Furthermore, the CMOS device 102 is integrated on the single substrate with the varactor 132 and the HBT 104. Such integration may be employed in a RFFE module to reduce size and parasitics of the RFFE module and to provide cost and cycle time savings.

The fabrication process 200 in FIG. 2 further includes forming a via to connect the first contacts 114 of the CMOS device 102 (block 214, stage 300(7) of FIG. 3C). As an example, the via may comprise a metal layer 332, such as a Ti layer and a Tungsten (W) layer.

Figure 3D:
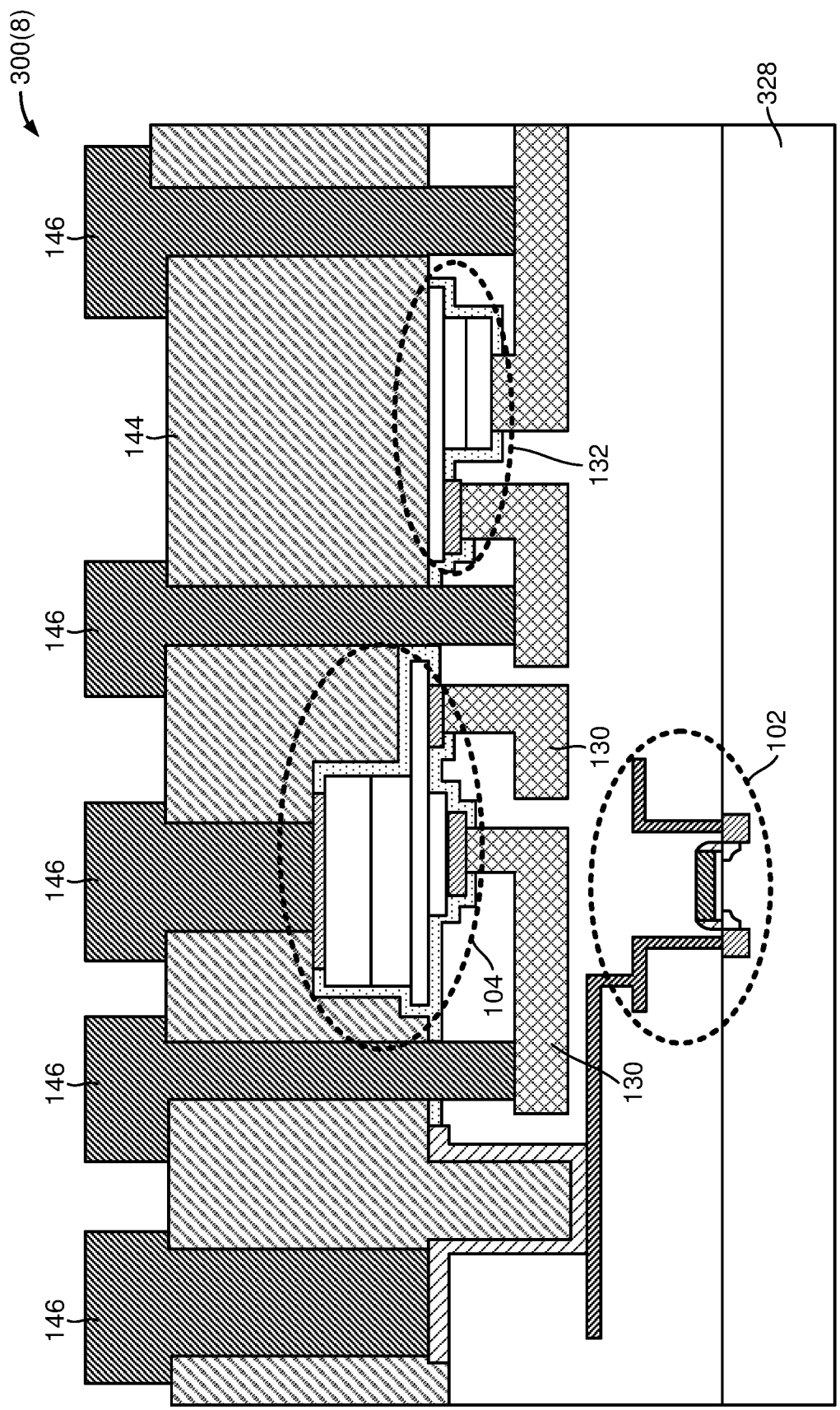

Next, the fabrication process 200 in FIG. 2 includes forming the second dielectric layer 144 and the fourth contacts 146 (block 216, stage 300(8) of FIG. 3D). The HBT 104 comprises the second contacts 130 on a first side and contacts the fourth contacts 146 on a second side. As mentioned above, the second contacts 130 and the fourth contacts 146 may comprise Ti/Pt/Cu. Cu possesses high thermal conductivity which can help to reduce self-heating of the HBT 104.

Figure 4A:
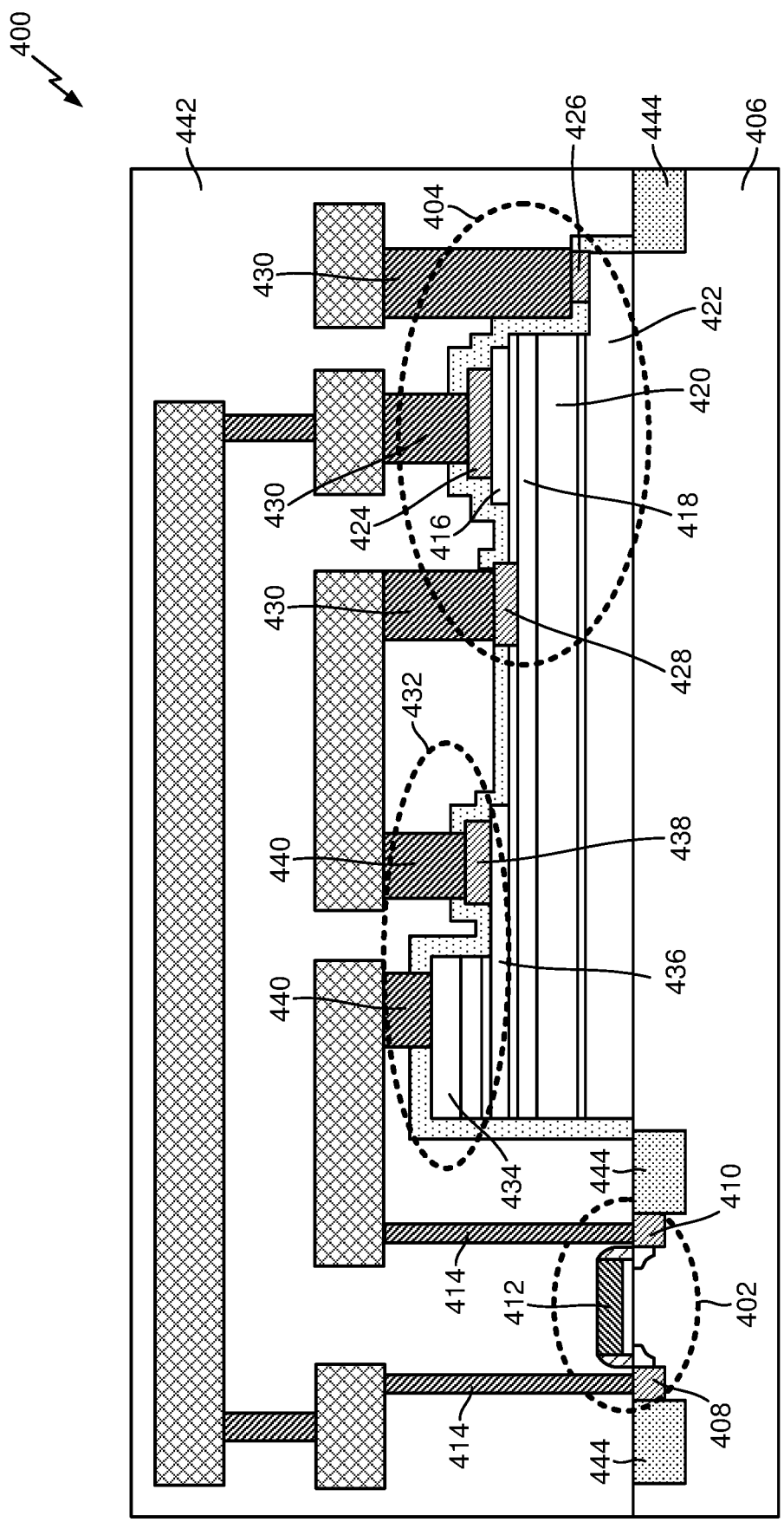
FIGS. 4A-4B illustrate an exemplary semiconductor device having a CMOS device and an HBT integrated on a single die in accordance with certain aspects of the present disclosure.

FIG. 4A illustrates another exemplary semiconductor device having a CMOS device and an HBT integrated on a single die in accordance with certain aspects of the present disclosure. In certain aspects, a semiconductor device 400 is shown in FIG. 4A, which comprises a first CMOS device 402 and an HBT 404 on a single die. As an example, the single die may comprise a Si substrate 406. The Si substrate 406 may comprise a plurality of shallow trench isolation (STI) regions 444. The first CMOS device 402 comprises a first drain region 408, a first source region 410, and a first gate 412. As an example, the first drain region 408, the first source region 410, and the first gate 412 may comprise Si. The first CMOS device 402 also comprises first contacts 414 to connect the first CMOS device 402 to other components in the semiconductor device 400. As an example, the first contacts 414 may comprise Al or Cu. The first CMOS device 402 may also comprise any device fabricated using CMOS process, including passive devices, such as capacitors and inductors.

With continuing reference to FIG. 4A, the HBT 404 comprises an emitter 416, a collector 420, and a base 418 between the emitter 416 and the collector 420. As an example, the emitter 416 may comprise an N+ GaAs layer, an InGaAs contact layer, and an InGaAs graded layer between the N+ GaAs layer and the InGaAs contact layer. As mentioned above, the InGaAs graded layer is employed to reduce the stress caused by the lattice mismatch between GaAs and InGaAs in the InGaAs contact layer. The collector 420 may comprise an N− GaAs collector. The base 418 may comprise a P+ GaAs base. The HBT 404 also comprises a sub-collector 422, an emitter metal 424, a collector metal 426, and a base metal 428. As an example, the sub-collector 422 may comprise an N+ GaAs sub-collector. The emitter metal 424 may comprise Ti/Pt, which forms an ohmic contact with the InGaAs contact layer of the emitter 416. The collector metal 426 may comprise Pd/Ge. The base metal 428 may comprise Pt/Ti. The HBT 404 further comprises second contacts 430 to connect the HBT 404 to other components in the semiconductor device 400. As an example, the second contacts 430 may comprise Ti/Pt/Cu. The first CMOS device 402 and the HBT 404 are integrated on the single die in the semiconductor device 400, which may be employed in a RFFE module to reduce size and parasitics of the RFFE module and to provide cost and cycle time savings.

With continuing reference to FIG. 4A, the semiconductor device 400 may also comprise a varactor 432 on the single die. The varactor 432 comprises an anode 434 and a cathode 436. As an example, the anode 434 may comprise N− GaAs. The cathode 436 may comprise an N+ GaAs layer, an InGaAs contact layer, and an InGaAs graded layer between the N+ GaAs layer and the InGaAs contact layer. As mentioned above, the InGaAs graded layer is employed to reduce the stress caused by the lattice mismatch between GaAs and InGaAs in the InGaAs contact layer. The varactor 432 further comprises third contacts 440 to connect the varactor 432 to other components in the semiconductor device 400. As an example, the third contacts 440 may comprise Ti/Pt/Cu. The second contacts 430 and the third contacts 440 may reside in a Metal 1 layer (i.e., a first layer of interconnect). The third contacts 440 form a Schottky contact with the anode 434 of the varactor 432. The Schottky contact is employed to form a depletion region during operation of the varactor 432. The third contacts 440 form an ohmic contact with the cathode 436 of the varactor 432 through a cathode contact layer 438 on the InGaAs contact layer of the cathode 436. The cathode contact layer 438 may comprise Ti/Pt. The ohmic contact is employed to improve quality factor of the varactor 432. By integrating the varactor 432 and the HBT 404 on the single die, a capacitance change of the varactor 432 may be employed to enable dynamic impedance tuning to optimize performance of the HBT 404 for power amplifier applications.

With continuing reference to FIG. 4A, the semiconductor device 400 may also comprise a dielectric layer 442 covering the first CMOS device 402, the HBT 404, and the varactor 432. As an example, the dielectric layer 442 may comprise $SiO_2$. The dielectric layer 442 has a first side and a second side opposite the first side. The first CMOS device 402 is coupled to the first side of the dielectric layer 442. The HBT 404 is coupled to the first side of the dielectric layer 442. The varactor 432 is coupled to the first side of the dielectric layer 442.

Figure 4B:
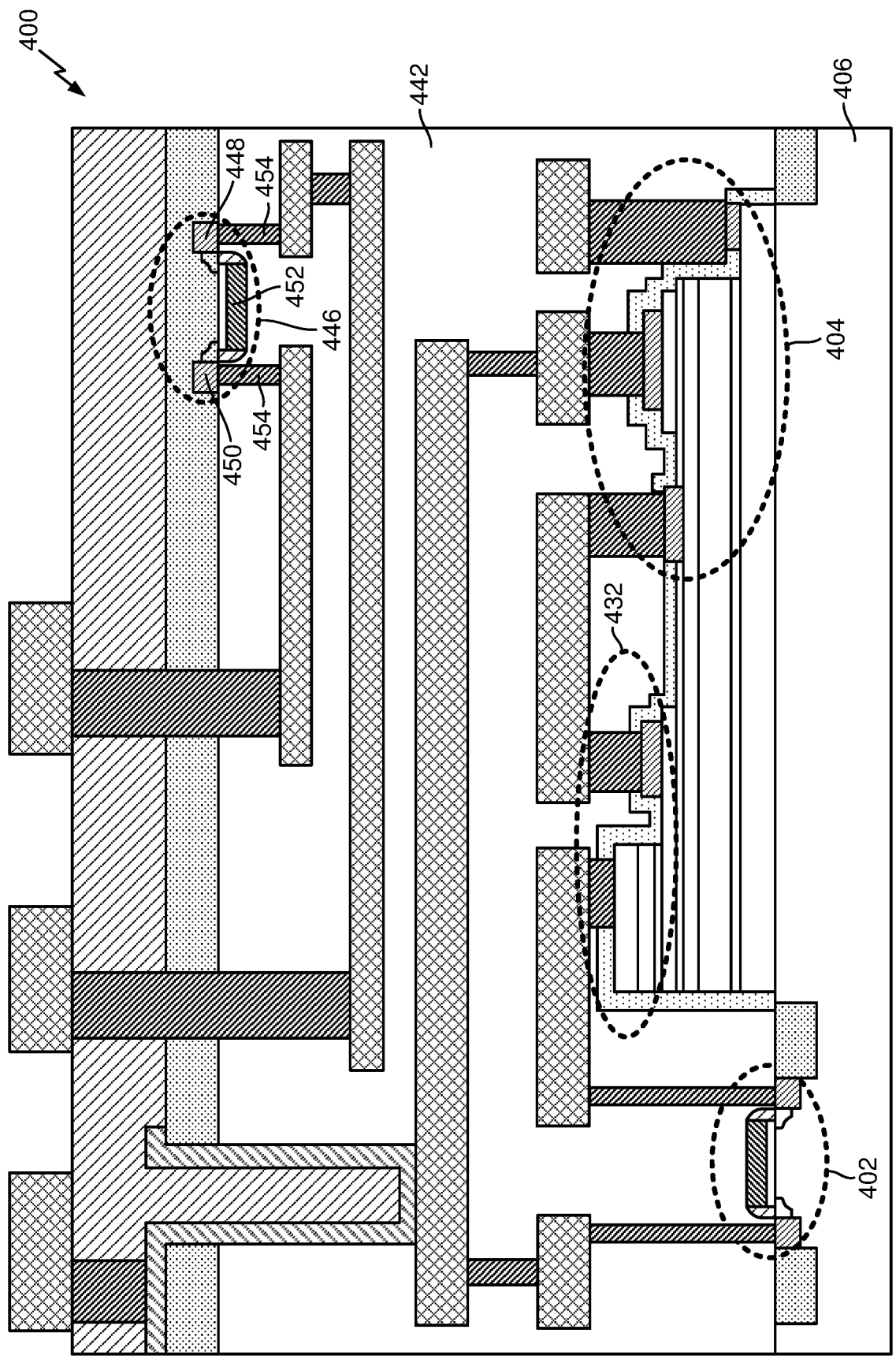

In certain aspects, the semiconductor device 400 may also comprise a second CMOS device 446 on the single die as illustrated in FIG. 4B. The second CMOS device 446 comprises a second drain region 448, a second source region 450, and a second gate 452. As an example, the second drain region 448, the second source region 450, and the second gate 452 may comprise Si. The second CMOS device 446 also comprises fourth contacts 454 to connect the second CMOS device 446 to other components in the semiconductor device 400. As an example, the fourth contacts 454 may comprise Al or Cu. The second CMOS device 446 may also comprise any device fabricated using CMOS process, including passive devices, such as capacitors and inductors. The second CMOS device 446 is coupled to the second side of the dielectric layer 442.

Figure 5:
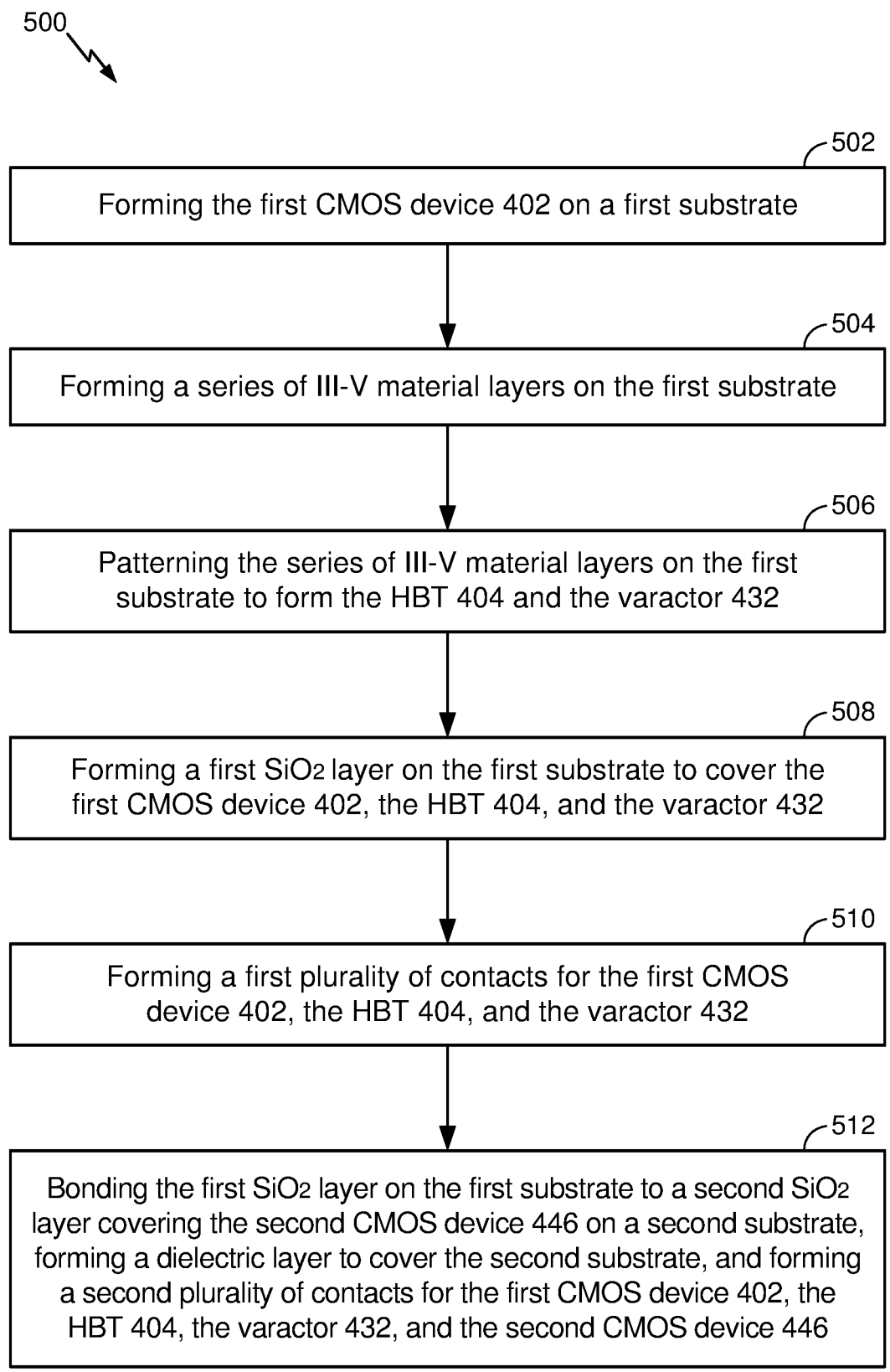
FIG. 5 provides a flow chart illustrating an exemplary fabrication process for the semiconductor device of FIGS. 4A-4B in accordance with certain aspects of the present disclosure.

FIG. 5 illustrates an exemplary fabrication process 500 for the semiconductor device 400 in FIGS. 4A-4B in accordance with certain aspects of the present disclosure.

In this regard, the fabrication process 500 in FIG. 5 includes forming the first CMOS device 402 on a first substrate (block 502). As an example, the first substrate may comprise a 300 mm Si wafer.

The fabrication process 500 in FIG. 5 also includes forming a series of III-V material layers on the first substrate (block 504). The series of III-V material layers may comprise an N+ GaAs sub-collector layer on the first substrate, a first InGaP etch stop layer on the N+ GaAs sub-collector layer, an N− GaAs collector layer on the first InGaP etch stop layer, a P+ GaAs base layer on the N− GaAs collector layer, a second InGaP etch stop layer on the P+ GaAs base layer, an emitter layer on the second InGaP etch stop layer, a third InGaP etch stop layer on the emitter layer, an N+ GaAs layer on the third InGaP etch stop layer, and an N− GaAs layer on the N+ GaAs layer. The emitter layer may comprise an N+ GaAs layer, an InGaAs contact layer, and an InGaAs graded layer between the N+ GaAs layer and the InGaAs contact layer. As mentioned above, the InGaAs graded layer is employed to reduce the stress caused by the lattice mismatch between GaAs and InGaAs in the InGaAs contact layer. In the alternative, other III-V materials, such as InP, may be used in the series of III-V material layers. The series of III-V material layers may be formed by epitaxy on the first substrate.

The fabrication process 500 in FIG. 5 also includes patterning the series of III-V material layers on the first substrate to form the HBT 404 and the varactor 432 (block 506). As an example, the series of III-V material layers may be patterned by dry etching or wet etching. The HBT 404 and the varactor 432 use different layers in the series of III-V material layers. Thus, each layer in the HBT 404 and the varactor 432 may have independently customized thicknesses and doping profiles, which may provide optimized performance for the HBT 404 and the varactor 432. The HBT 404 and the varactor 432 are integrated on a single substrate (i.e., the first substrate). Thus, a capacitance change of the varactor 432 may be employed to enable dynamic impedance tuning to optimize the performance of the HBT 404 for power amplifier applications. Furthermore, the first CMOS device 402 is integrated on the single substrate with the HBT 404 and the varactor 432. Such integration may be employed in a RFFE module to reduce size and parasitics of the RFFE module and to provide cost and cycle time savings. The HBT 404 contacts the first substrate on a first side. As mentioned above, the first substrate may comprise Si. Si possesses high thermal conductivity which can help to reduce self-heating of the HBT 404.

The fabrication process 500 in FIG. 5 also includes forming a first $SiO_2$ layer on the first substrate to cover the first CMOS device 402, the HBT 404, and the varactor 432 (block 508).

The fabrication process 500 in FIG. 5 further includes forming a first plurality of contacts for the first CMOS device 402, the HBT 404, and the varactor 432 (block 510).

Next, the fabrication process 500 in FIG. 5 includes bonding the first $SiO_2$ layer on the first substrate to a second $SiO_2$ layer covering the second CMOS device 446 on a second substrate, forming a dielectric layer to cover the second substrate, and forming a second plurality of contacts for the first CMOS device 402, the HBT 404, the varactor 432, and the second CMOS device 446 (block 512). As an example, the second substrate may comprise a 300 mm Si wafer.

The elements described herein are sometimes referred to as means for performing particular functions. In this regard, the HBT 104 and 404 are sometimes referred to herein as "means for power amplifying." The varactor 132 and 432 are sometimes referred to herein as "means for capacitance tuning." According to a further aspect of the present disclosure, the aforementioned means may be any layer, module, or any apparatus configured to perform the functions recited by the aforementioned means.

The semiconductor device comprising the CMOS device and the HBT integrated on the single die according to certain aspects disclosed herein may be provided in or integrated into any electronic device. Examples, without limitation, include a set top box, an entertainment unit, a navigation device, a communication device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, and a drone.

Figure 6:
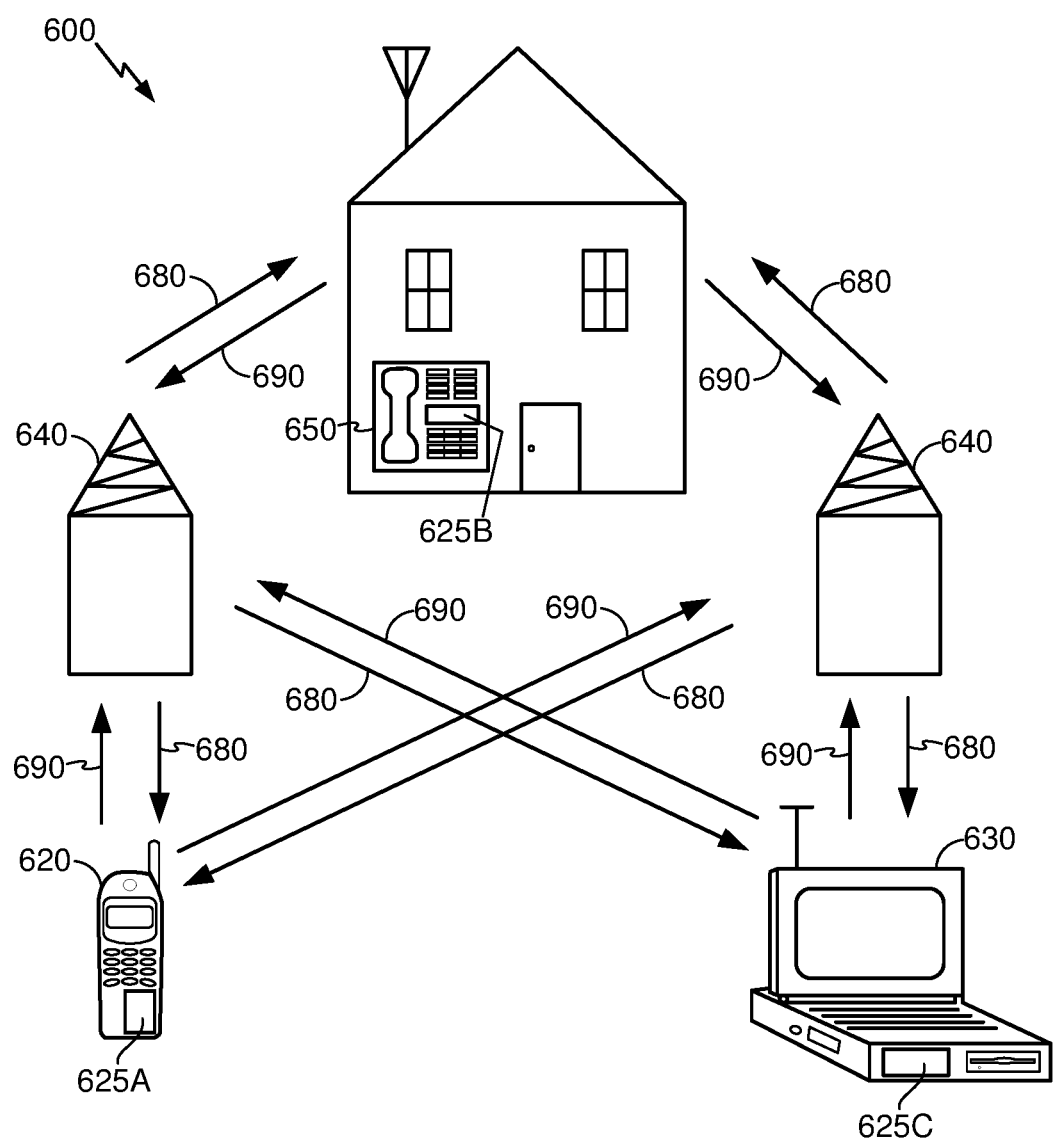
FIG. 6 is a block diagram showing an exemplary wireless communication system in which an aspect of the present disclosure may be employed.

In this regard, FIG. 6 is a block diagram showing an exemplary wireless communication system 600 in which an aspect of the present disclosure may be employed. For purposes of illustration, FIG. 6 shows three remote units 620, 630, and 650 and two base stations 640. It will be recognized that wireless communication systems may have many more remote units and base stations. Remote units 620, 630, and 650 include integrated circuit (IC) devices 625A, 625C, and 625B that may include the disclosed semiconductor device. It will be recognized that other devices may also include the disclosed semiconductor device, such as the base stations, switching devices, and network equipment. FIG. 6 shows forward link signals 680 from the base stations 640 to the remote units 620, 630, and 650 and reverse link signals 690 from the remote units 620, 630, and 650 to the base stations 640.

In FIG. 6, remote unit 620 is shown as a mobile telephone, remote unit 630 is shown as a portable computer, and remote unit 650 is shown as a fixed location remote unit in a wireless local loop system. For example, a remote unit may be a mobile phone, a hand-held personal communication systems (PCS) unit, a portable data unit such as a PDA, a GPS enabled device, a navigation device, a set top box, a music player, a video player, an entertainment unit, a fixed location data unit, such as a meter reading equipment, or other communication device that stores or retrieves data or computer instructions, or combinations thereof. Although FIG. 6 illustrates remote units according to the certain aspects of the present disclosure, the disclosure is not limited to these exemplary illustrated units. Certain aspects of the present disclosure may be suitably employed in many devices, which include the disclosed semiconductor device.

Those of skill in the art will further appreciate that the various illustrative logical blocks, modules, circuits, and algorithms described in connection with the certain aspects disclosed herein may be implemented as electronic hardware, instructions stored in memory or in another computer readable medium and executed by a processor or other processing device, or combinations of both. The devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the certain aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and features disclosed herein.

What is claimed is:

1. A semiconductor device, comprising a complementary metal oxide semiconductor (CMOS) device on a die; a heterojunction bipolar transistor (HBT) on the die; a varactor on the die; and a silicon dioxide ($SiO_2$) layer on the die, wherein the $SiO_2$ layer has a first side and a second side opposite the first side, and wherein the CMOS device is coupled to the first side of the $SiO_2$ layer, the HBT is coupled to the second side of the $SiO_2$ layer, and the varactor is coupled to the second side of the $SiO_2$ layer.

2. The semiconductor device of claim 1, wherein the CMOS device comprises silicon (Si).

3. The semiconductor device of claim 1, wherein the HBT comprises III-V materials.

4. The semiconductor device of claim 3, wherein the III-V materials comprise at least one of gallium arsenide (GaAs) and indium phosphide (InP).

5. The semiconductor device of claim 1, wherein the die comprises Si.

6. The semiconductor device of claim 4, wherein the HBT comprises an emitter, a collector, and a base between the emitter and the collector, and wherein the emitter comprises an N+ GaAs layer, an indium gallium arsenide (InGaAs) contact layer, and an InGaAs graded layer between the N+ GaAs layer and the InGaAs contact layer.

7. The semiconductor device of claim 1, wherein the varactor comprises III-V materials.

8. The semiconductor device of claim 7, wherein the III-V materials comprise at least one of GaAs and InP.

9. The semiconductor device of claim 8, wherein the varactor comprises an anode and a cathode, and wherein the anode comprises N− GaAs and the cathode comprises an N+ GaAs layer, an InGaAs contact layer, and an InGaAs graded layer between the N+ GaAs layer and the InGaAs contact layer.

10. The semiconductor device of claim 9, wherein the varactor further comprises a cathode contact layer on the InGaAs contact layer of the cathode, and wherein the cathode contact layer comprises titanium (Ti)/platinum (Pt).

11. The semiconductor device of claim 1 integrated into a device selected from the group consisting of: a set top box; an entertainment unit; a navigation device; a communication device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; and a drone.

12. A method for fabricating a semiconductor device, comprising:
    forming a series of layers on a first substrate;
    patterning the series of layers on the first substrate to form a varactor;
    forming a first silicon dioxide ($SiO_2$) layer to cover the varactor on the first substrate;
    bonding the first $SiO_2$ layer to a second $SiO_2$ layer covering a complementary metal oxide semiconductor (CMOS) device on a second substrate;
    removing the first substrate;
    patterning the series of layers to form a heterojunction bipolar transistor (HBT);
    forming a dielectric layer to cover the varactor and the HBT; and
    forming contacts for the varactor, the CMOS device, and the HBT.

13. The method of claim 12, wherein the series of layers comprise III-V materials.

14. The method of claim 13, wherein the III-V materials comprise at least one of gallium arsenide (GaAs) and indium phosphide (InP).

15. The method of claim 13, wherein the series of layers comprise indium gallium phosphide (InGaP) etch stop layers.

16. The method of claim 13, wherein the varactor comprises III-V materials.

17. The method of claim 16, wherein the varactor comprises an anode and a cathode, and wherein the anode comprises N− GaAs and the cathode comprises an N+ GaAs layer, an indium gallium arsenide (InGaAs) contact layer, and an InGaAs graded layer between the N+ GaAs layer and the InGaAs contact layer.

18. The method of claim 17, wherein the varactor further comprises a cathode contact layer on the InGaAs contact layer of the cathode, and wherein the cathode contact layer comprises titanium (Ti)/platinum (Pt).

19. The method of claim 13, wherein the HBT comprises III-V materials.

20. The method of claim 19, wherein the HBT comprises an emitter, a collector, and a base between the emitter and the collector, and wherein the emitter comprises an N+ GaAs layer, an InGaAs contact layer, and an InGaAs graded layer between the N+ GaAs layer and the InGaAs contact layer.

21. The method of claim 12, wherein the first substrate and the second substrate comprise silicon (Si).

22. The method of claim 12, wherein the CMOS device comprises Si.

23. A method for fabricating a semiconductor device, comprising:
   forming a first complementary metal oxide semiconductor (CMOS) device on a first substrate;
   forming a series of III-V material layers on the first substrate;
   patterning the series of III-V material layers on the first substrate to form a heterojunction bipolar transistor (HBT);
   forming a first silicon dioxide ($SiO_2$) layer to cover the first CMOS device and the HBT on the first substrate;
   forming a first plurality of contacts for the first CMOS device and the HBT;
   bonding the first $SiO_2$ layer on the first substrate to a second $SiO_2$ layer covering a second CMOS device on a second substrate;
   forming a dielectric layer to cover the second substrate; and
   forming a second plurality of contacts for the first CMOS device, the HBT, and the second CMOS device.

* * * * *